(12) United States Patent
Morbe et al.

(10) Patent No.: US 7,403,399 B2
(45) Date of Patent: Jul. 22, 2008

(54) ACTIVE PRIMARY-SIDED CIRCUIT ARRANGEMENT FOR A SWITCH-MODE POWER SUPPLY

(75) Inventors: Stefan Morbe, Hasbergen (DE); Michael Bothe, Munster (DE)

(73) Assignee: FRIWO Mobile Power GmbH, Ostbevern (DE)

( * ) Notice: Subject to any disclaimer, the term of this patent is extended or adjusted under 35 U.S.C. 154(b) by 313 days.

(21) Appl. No.: 11/394,734

(22) Filed: Mar. 30, 2006

(65) Prior Publication Data
US 2006/0238927 A1 Oct. 26, 2006

(30) Foreign Application Priority Data
Mar. 31, 2005 (DE) .................. 10 2005 014 746

(51) Int. Cl.
*H02M 1/00* (2007.01)
*H01K 7/06* (2006.01)

(52) U.S. Cl. .................. 361/820; 323/351; 363/37; 363/97

(58) Field of Classification Search .................. 361/820; 362/37, 97; 323/351
See application file for complete search history.

(56) References Cited

U.S. PATENT DOCUMENTS 5,355,301 A 10/1994 Saito et al.
6,134,123 A 10/2000 Yamada

FOREIGN PATENT DOCUMENTS

DE 39 16 980 12/1989

*Primary Examiner*—Evan Pert
(74) *Attorney, Agent, or Firm*—Michael Best & Friedrich LLP

(57) ABSTRACT

The invention under consideration refers to a circuit arrangement for a switch-mode power supply, wherein the switch-mode power supply has a primary side, which can be connected to a supply voltage, and a secondary side, which can be connected to a consumer, and wherein the circuit arrangement comprises a primary-sided switch, a control circuit for controlling the primary-sided switch and additional active primary-sided components. Furthermore, the invention under consideration also refers to a switch-mode power supply with an active primary-sided circuit arrangement of that type. In order to specify an improved circuit arrangement that overcomes the disadvantages of the known solutions and that makes it possible to assemble a switch-mode power supply in miniaturised form in a manner that is particularly simple and economical while still complying with applicable safety standards, the control circuit is formed by a first integrated semiconductor chip and the primary-sided switch and the additional components are integrated in at least one additional semiconductor chip, said semiconductor chip being separate from the control circuit and being arranged on a single circuit carrier shared with the control circuit.

13 Claims, 3 Drawing Sheets

ACTIVE PRIMARY-SIDED CIRCUIT ARRANGEMENT FOR A SWITCH-MODE POWER SUPPLY

BACKGROUND OF THE INVENTION

1. Field of the Invention

The present invention relates to a circuit arrangement for a switch-mode power supply, wherein the switch-mode power supply has a primary side, which can be connected to a supply voltage, and a secondary side, which can be connected to a consumer, and wherein the circuit arrangement comprises a primary-sided switch, a control circuit for controlling the primary-sided switch and additional active primary-sided components. Furthermore, the invention under consideration also refers to a switch-mode power supply with such an active primary-sided circuit arrangement.

2. Description of the Related Art

Charging devices in the low power range are normally implemented as switch-mode power supplies today. Because of the compact design and low weight, these have gained acceptance in many application cases and are superseding the traditional linear devices. In spite of the advancing integration of separate circuit components, such as in the form of integrated circuits specific to the user (so-called ASICs, or Application Specific Integrated Circuits), for example, the electronics needed for a switch-mode power supply are still comparatively complex and the primary-sided circuit arrangement of a switch-mode power supply of that type consists of more than 20 separate circuit components.

FIG. 1, in the form of a wiring diagram, shows the circuit diagram of the primary side of a switch-mode power supply with primary regulation. The total of 24 components can be assigned here as follows: a converter-transformer 120, in which only the primary-sided winding 122 and the auxiliary winding 124 are depicted, 16 passive components, such as resistors, inductors and capacitors, and up to eight active components. The active components form the active primary-sided circuit arrangement of the switch-mode power supply and comprise four single diodes, which form a bridge rectifier 106, the switching transistor 102, an ASIC for pulse width modulation of the primary-sided switching transistor as control circuit 104 of the primary-sided switch 102, an auxiliary voltage diode 108 and a snubber diode 110.

In order to reduce the space requirements of the single components, there are currently various approaches, most of which are, however, not far-reaching enough and extend over only a few elements.

For example, in the area of the passive components, various resistors and even RC functions are integrated in one element array.

From the US American printed patent specification U.S. Pat. No. 6,134,123, it is furthermore known to accommodate the primary-sided switch and the control circuit for a switch-mode power supply on a common substrate and to produce it as a hybrid IC.

The solution disclosed in this publication, however, has the disadvantage that a major portion of the space-consuming elements, such as the rectifier or the auxiliary voltage and snubber diodes are still provided as external elements. Therefore, although this known solution achieves increased stability of the switch-mode power supply because of the spatial proximity of the control circuit and the primary-sided switch, no more extensive advantages are achieved with regard to miniaturization of a switch-mode power supply of that type.

Furthermore, from U.S. Pat. No. 5,355,301, a switch-mode power supply is known in which a printed converter is used. The active components, i.e., the bridge rectifier, primary-sided switch, control circuit and secondary diode are integrated in a single chip in this case and, assembled with the printed converter in a shared substrate. The contacting between this active chip and the voltage-converting area is accomplished via a further wiring layer. The contacting to the active chip is produced here via appropriate openings in the chip. The active element is consequently a constituent of a fully integrated switch-mode power supply and is not produced as a separate IC in its own IC housing.

The solution shown here therefore has, firstly, the disadvantage that the secondary diode that is also integrated does not make possible primary/secondary separation according to applicable standards. Furthermore, the technical solution of a fully integrated switch-mode power supply represents a very complex concept that can only be realized with high manufacturing costs.

In addition to the mentioned complexity of the components, the manufacture of the known switch-mode power supplies additionally requires complex logistics for the procurement of the single components and substantial investments in pick-and-place machines and testing technology for the manufacture.

SUMMARY OF THE INVENTION

There is, therefore, a need for providing an improved circuit arrangement, which overcomes the disadvantages of the known solutions and makes it possible to assemble a switch-mode power supply in miniaturized form in an especially simple and economical way, while still complying with applicable safety standards.

This object is solved by means of the subject matter of claim 1. Advantageous further developments of the invention under consideration are the subject matter of various dependent claims.

The present invention is based on the idea that, in the case of a primary-sided switch-mode power supply, a circuit arrangement that comprises the primary-sided switch, a control circuit for controlling the primary-sided switch and additional active primary-sided components is executed in such a way that the control circuit is formed by a first integrated semiconductor chip and that the primary-sided switch and the additional components are integrated in at least one additional semiconductor chip, said semiconductor chip being separate from the control circuit and arranged on a circuit carrier shared with the control circuit.

In this way, a number of active components can be combined with the help of a circuit arrangement according to the invention in the form of a module, said components being found in a primary circuit of a switch-mode power supply. These are the components of the input rectifier for the 50/60 Hz voltage, the switching transistor, the control circuit and diodes for the snubber circuit and the auxiliary power supply.

The active components here are not executed in a discrete construction, as is customary, but are instead assembled on a shared circuit carrier and, according to an advantageous further development, accommodated in a shared IC housing. In this way, the result is a considerable decrease in the space requirement, as well as a reduction of possible error sources caused by faulty contacting of the individual elements to a further circuit carrier, for example, a printed circuit board. Furthermore, advantages arise during the production process as a result of the considerably reduced logistics effort for procuring elements. Because of the combination into a single element, the effort for mounting is reduced, and therefore the investments in the manufacture are also reduced.

If one compares known circuit arrangements that are assembled in a discrete construction with an implementation according to the present invention, the minimum area requirement of the discretely assembled single components amounts to approximately 100 mm$^2$, wherein the likewise required electrical connections between these elements are not taken into consideration. The integrated module according to the present invention can be implemented with dimensions of 5×5 mm$^2$ or less, however, and consequently demands only a quarter of the area of conventional circuit arrangements.

Furthermore, with the circuit arrangement according to the invention, it is also possible to achieve a reduction in the overall heights in comparison to single components. The individual semiconductor chips are arranged next to one another, so that the result is a lower overall height. The additional space requirement for this arrangement in one level is more than compensated for by the integration of the active components and the savings in area associated with it. While the overall height of single elements amounts to up to 3 mm, when all elements are integrated, for example, into a so-called MLP housing (Micro Leadframe Package), the height is only 1 mm.

The circuit arrangement according to the invention can be executed here either in a wired housing or in a housing that can be surface-mounted for Surface Mount Technology (SMT). The wired elements in this case are compatible with conventional Through Hole Technology (THT), while in the case of an embodiment as an SMD (Surface Mounted Device), the advantages of this extensively miniaturized technology can be utilized.

With this low overall height, two-sided cooling of the circuit module is furthermore possible in an advantageous way. For example, the metallization of a leadframe can be run out towards the bottom, directly on to the printed circuit board. Because of the low height and the good heat conduction by the housing that is associated with said low height, cooling even on the surface brings significant advantages.

Furthermore, continued monolithic integration of the elements used can make it possible to achieve additional miniaturisation of the circuit arrangement, and the number of electrical connections among the elements can be reduced, so that the reliability of the entire element can be increased.

An additional advantage of the solution according to the invention exists in the reduction of parasitic inductances, which result from connections among the discrete elements. Because the distances between elements are greatly reduced in comparison to the discrete version, parasitic inductances of the electrical connections are greatly reduced. This applies both to connections within the module and to connections outside it.

Last but not least, it is naturally also possible to realise cost benefits as a result of the savings in the overall height and overall area.

According to an advantageous further development of the present invention, if one implements those additional components that are under high voltages in Silicon-on-insulator technology (SOI) and the control circuit in conventional silicon technology, it is possible to achieve a reduction in the installation size, because the distances between the parts under high voltages can again be reduced. Without SOI, if, for example, there were four rectifier diodes, one would have to place each of the four dies on different areas of a leadframe. These areas have to be somewhat larger than the corresponding die. In SOI technology, one can realise the four diodes in a single die, so that the additional space requirements for the areas on the leadframe, including the insulation gaps in between, are dropped.

The advantageous properties of the circuit arrangement according to the invention are particularly effective when used in a primary-controlled switch-mode power supply.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention is illustrated in the accompanying drawings, wherein.

DETAILED DESCRIPTION OF THE INVENTION

The illustrated embodiments of the present invention will be described with reference to the figure drawings wherein like elements and structures are indicated by like reference numbers.

Referring to the figures, and particularly to FIG. 2, a first embodiment of the active primary-sided circuit arrangement 100 according to the invention will be explained in more detail. In the embodiment shown, the circuit arrangement according to the invention is implemented by way of example as a so-called "Micro Leadframe Package" component (MLP component). A leadframe 112 functions as the circuit carrier here and can, for example, be made of a copper alloy. The individual semiconductor elements are glued or soldered to the respective areas of the leadframe 112 that are provided for them and appropriately contacted using bonding wires 114.

One example of an advantage of MLP technology is that extremely small dimensions can be achieved when conventional copper-leadframe technology is used. At the same time, the electrical and thermal properties can be improved.

As a shared housing, which is referred to schematically with the reference number 118, a casting compound, for example, an epoxy resin, is die-cast around the arrangement.

Naturally the principles according to the invention can also be used for other housing and circuit carrier technologies. For example, ceramic circuit carriers, flexible circuit carriers, ball grid arrays or the like can be used.

Figure 1:
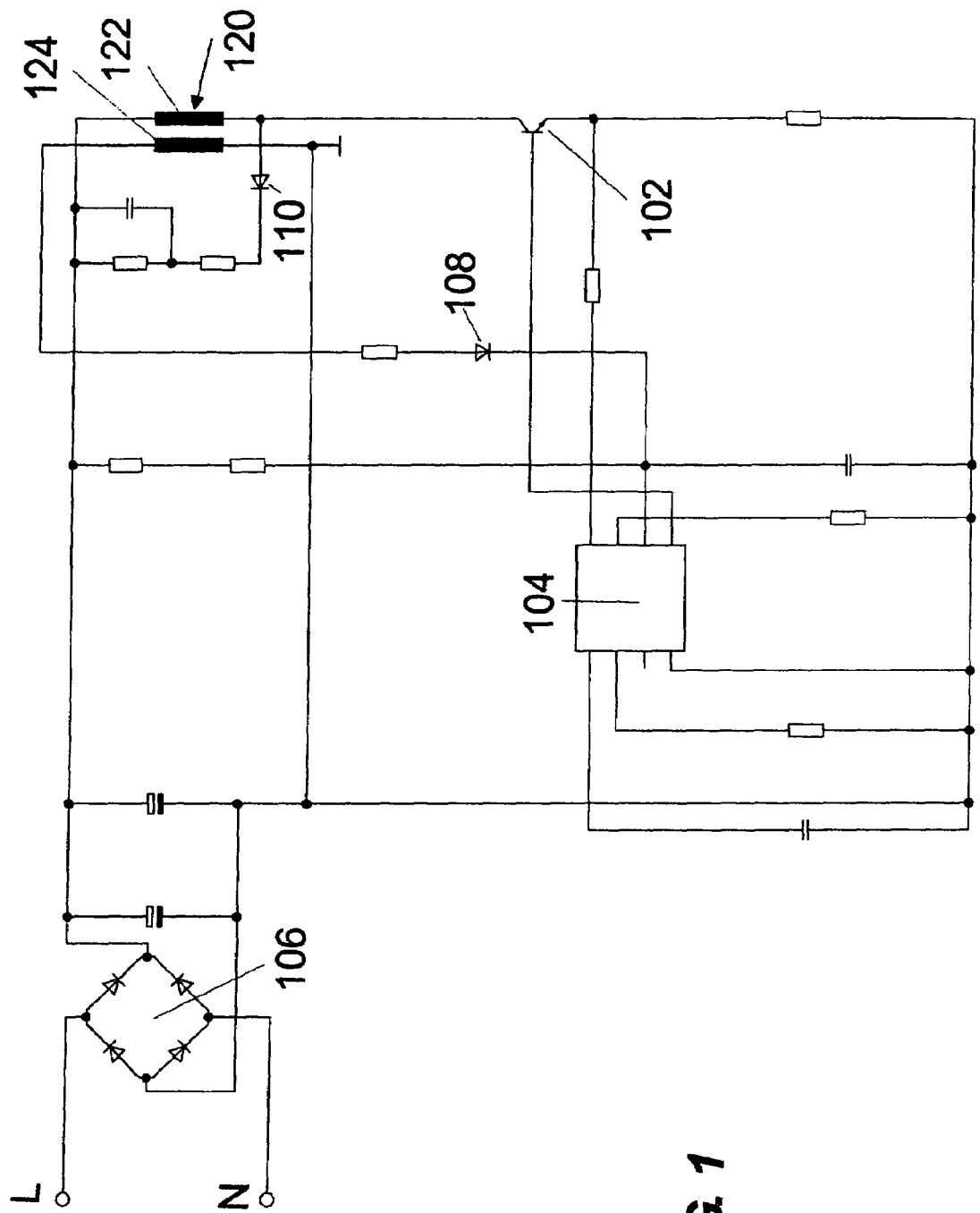
FIG. 1 shows a circuit diagram for a primary-sided circuit arrangement for a switch-mode power supply.
Figure 2:
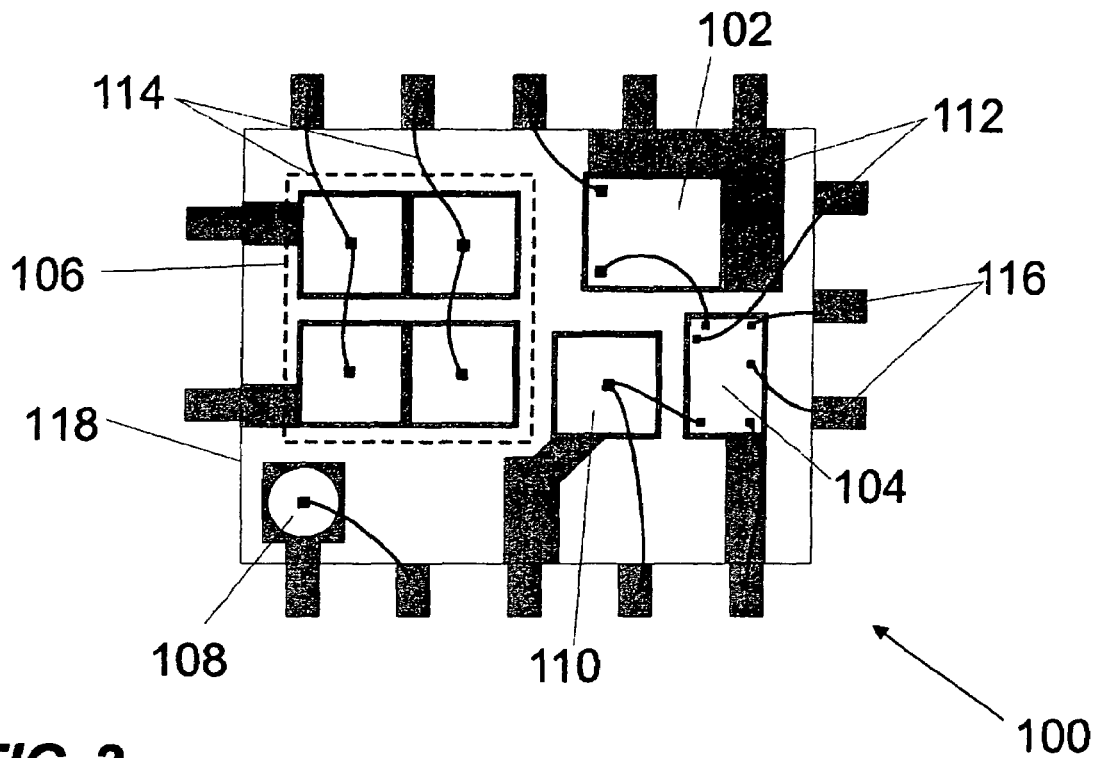
FIG. 2 shows an active primary-sided circuit arrangement according to the invention on a circuit carrier in accordance with a first embodiment.

In the embodiment shown in FIG. 2, the switching transistor 102, the control circuit 104 (also identified as the control IC), as well as the snubber diode 110, the diodes for the bridge rectifier 106 and the diode for the auxiliary power supply 108 are initially present as separate semiconductor chips, also called dies. Corresponding areas are present on the leadframe 112 in order to be able to hold the various semiconductor chips. A single contacting of the semiconductor chip to the outer terminals 116 of the module can be produced via these areas. All additional contacting of the semiconductor chips to the outer terminals 116 of the module can be produced via bonding wires 114. These bonding wires 116 can, for example, be produced from gold, as so-called thermo-ultrasound bonding connections.

To some extent, connections between the elements used in the module, for example, between the control IC 104 and the switching transistor 102, are stipulated by the circuit topology. These connections can be produced by means of internal bonding wires during the manufacture. This simplifies the layout of a printed circuit board that is not shown here, on which the module will be applied at a later time.

In the design of the leadframe 112, it is always necessary to pay attention to voltage differences and corresponding insulation, as well as to sufficient heat dissipation. Parts of the circuit arrangement 100 according to the invention that are under high voltages, for example, the bridge rectifier 106, and parts with lower voltages, e.g., the diode for the auxiliary voltage 108 must be appropriately arranged so that they are physically separated or electrically insulated.

For elements that require a large cooling surface, a correspondingly large metal surface can be provided on the leadframe 112. This is shown for the switching transistor 102 in FIG. 2 by way of example. This metal surface of the leadframe 112 can also be openly run downwards out of the circuit arrangement housing, which is not shown here, and come to rest directly on the printed circuit board, so that a good thermal connection to the printed circuit board is attained.

Optionally, it is also possible to use several external terminals 116 for an internal terminal, in order to increase the current-carrying capacity of the corresponding internal terminal.

Figure 3:
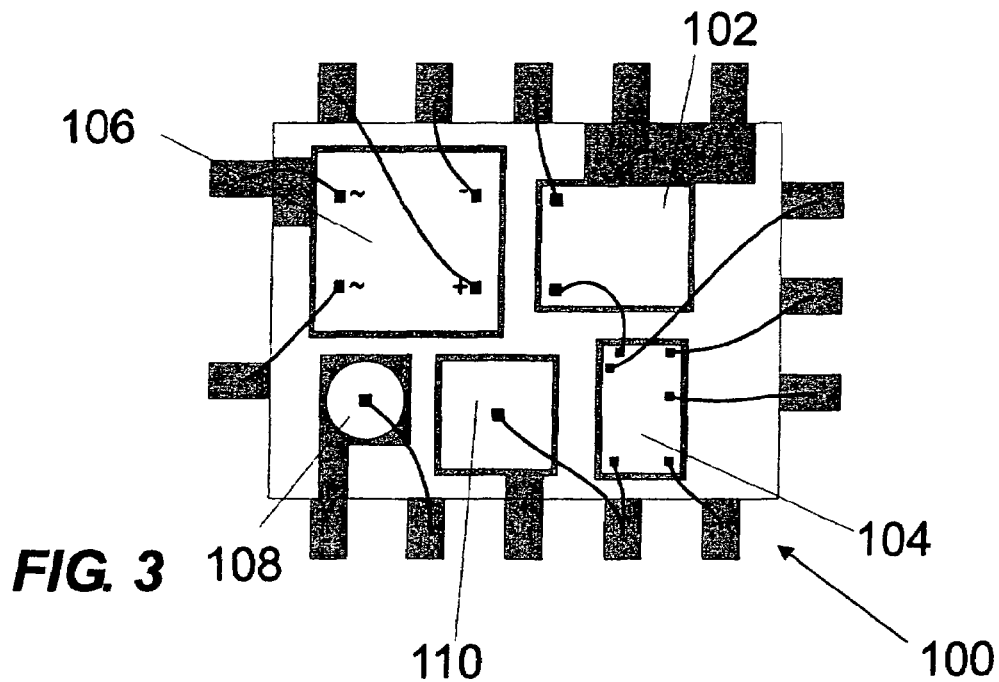
FIG. 3 shows a second advantageous embodiment with monolithically integrated bridge rectifier.

Further miniaturisation of the overall arrangement can be achieved by means of additional monolithic integration of multiple elements within the circuit arrangement 100. FIG. 3 shows an embodiment in which an integrated bridge rectifier circuit 106 is provided, in place of the four single diodes of the bridge rectifier. Instead of the four individual diode chips shown in FIG. 2, all four diodes are integrated on one die in silicon-on-insulator (SOI) technology. With the help of this technology, further miniaturisation of the module 100 can be achieved, because a compact construction of the individual constituents of the circuit results from the monolithic integration.

Figure 4:
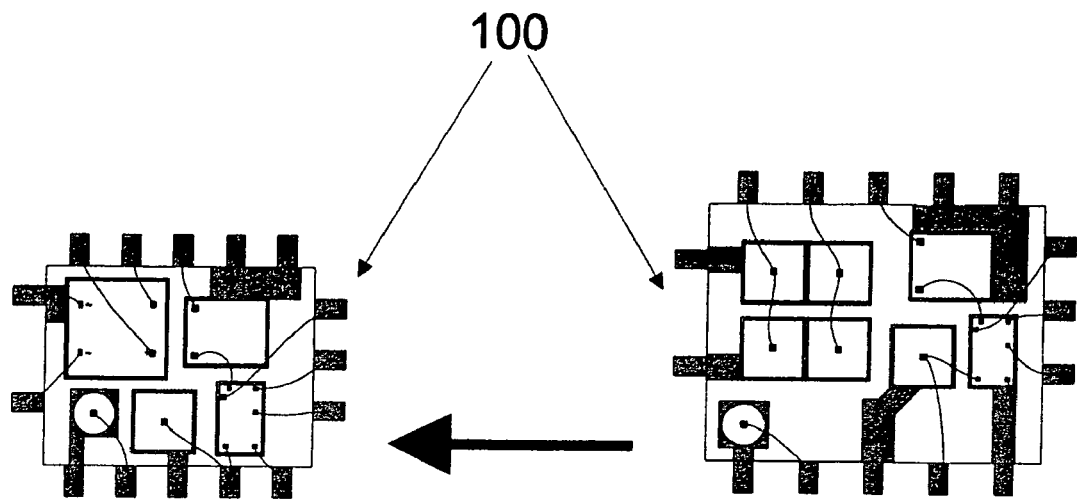
FIG. 4 shows a full-scale comparison of the embodiments shown in FIGS. 2 and 3, for a comparison of the sizes.

A comparison of the relative sizes is shown in FIG. 4 by means of a full-scale comparison of the circuit arrangements 100 from FIG. 2 and FIG. 3. By using a monolithically integrated element for the bridge rectifier 106, it is possible to reduce the required area from about 20 mm$^2$ to about 12 mm$^2$.

Figure 5:
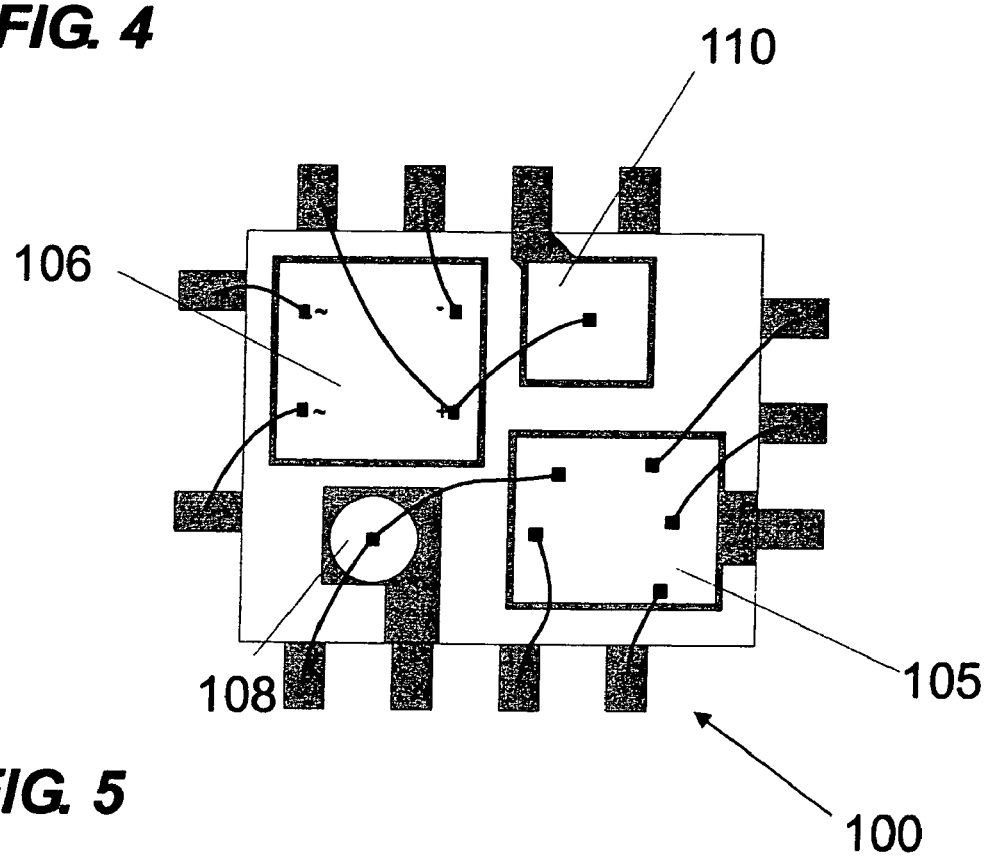
FIG. 5 shows a third embodiment of the circuit arrangement according to the invention.

If additional elements are combined, for example, the control circuit 104 and the switching transistor 102, one arrives at a configuration such as the one shown in FIG. 5. The dimensions here can be even further reduced in that, on the one hand, the required area becomes even less because a single IC 105 is used instead of the single chips 102 and 104 shown in FIG. 2 and because, in particular, there is also a reduction in the number of internal connections made with bonding wires. This elimination of internal bonding wires furthermore also increases the reliability of the overall circuit arrangement.

With the help of the method according to the invention, namely the integration of the active primary-sided components on one circuit carrier and in a single housing, the result is consequently that, first, the necessary constructed space is significantly reduced and, second, that additional miniaturization can be achieved by means of the further monolithic integration of the elements used. In addition to the savings in the constructed space, a clear increase in the reliability of the overall element is also possible.

The circuit arrangement according to the invention can naturally be executed both for the SMD (Surface Mounted Device) and as a wired element for conventional through-hole technology.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention.

In addition, those areas in which it is believed that those ordinary skilled in the art are familiar have not been described herein in order to not unnecessarily obscure the invention described herein. Accordingly, it is to be understood that the invention is not to be limited by the specific illustrated embodiments, but only by the scope of the appended claims.

What is claimed is:

1. Circuit arrangement for a switch-mode power supply, wherein the switch-mode power supply has a primary side, which can be connected to a supply voltage, and a secondary side, which can be connected to a consumer, wherein the circuit arrangement (100) comprises a primary-sided switch (102), a control circuit (104) for controlling the primary-sided switch (102) and additional active, primary-sided components (106, 108, 110), wherein said control circuit (104) is formed by a first integrated semiconductor chip and the primary-sided switch (102) and the additional components (106, 108, 110), are integrated in at least one additional semiconductor chip, said semiconductor chip being separate from the control circuit and arranged on a circuit carrier (112) shared with the control circuit.

2. Circuit arrangement according to claim 1, wherein the control circuit (104), the primary-sided switch (102) and the additional primary-sided components (106, 108, 110) are accommodated in a shared housing (118).

3. Circuit arrangement according to claim 2, wherein the housing (118) is executed as a wired housing.

4. Circuit arrangement according to claim 2, wherein the housing (118) is executed as a housing that can be surface-mounted for surface-mount technologies.

5. Circuit arrangement according to claim 1, wherein the circuit carrier is executed as a leadframe (112).

6. Circuit arrangement according to claim 1, wherein a metallization of the circuit carrier (112) has cooling areas that are formed for removing heat.

7. Circuit arrangement according to claim 1, wherein the additional active components comprise four rectifier diodes (106).

8. Circuit arrangement according to claim 1, wherein the additional active components comprise a diode (108) for the auxiliary power supply.

9. Circuit arrangement according to claim 1, wherein the additional active components comprise a snubber diode (110).

10. Circuit arrangement according to claim 1, wherein the additional active components (106, 108, 110) are at least partially combined into a single semiconductor chip and are monolithically integrated.

11. Circuit arrangement according to claim 1, wherein at least those additional components (106, 108, 110) that are under high voltages are executed in a silicon-on-insulator technology and the control circuit (104) is formed as a silicon semiconductor circuit.

12. Circuit arrangement according to claim 1, wherein the circuit carrier has a ceramic substrate comprising multiple layers.

13. Switch-mode power supply having a primary side, which can be connected to a supply voltage, and a secondary side, which can be connected to a consumer, said switch-mode power supply comprising a circuit arrangement which comprises a primary-sided switch, a control circuit for controlling the primary-sided switch and additional active, primary-sided components, wherein said control circuit is formed by a first integrated semiconductor chip and the primary-sided switch and the additional components, are integrated in at least one additional semiconductor chip, said semiconductor chip being separate from the control circuit and arranged on a circuit carrier shared with the control circuit.

* * * * *